(12) United States Patent
Li et al.

(10) Patent No.: US 11,139,413 B2
(45) Date of Patent: Oct. 5, 2021

(54) PHOTOVOLTAIC CHARGING SYSTEM

(71) Applicant: International Business Machines Corporation, Armonk, NY (US)

(72) Inventors: Ning Li, White Plains, NY (US); Devendra K. Sadana, Pleasantville, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 77 days.

(21) Appl. No.: 15/840,005

(22) Filed: Dec. 13, 2017

(65) Prior Publication Data

US 2019/0181293 A1 Jun. 13, 2019

(51) Int. Cl.
| | |
|---|---|
| H01L 31/167 | (2006.01) |
| H01L 31/0693 | (2012.01) |
| H01L 31/0224 | (2006.01) |
| H01L 31/18 | (2006.01) |
| H01L 31/0304 | (2006.01) |

(52) U.S. Cl.
CPC .... *H01L 31/167* (2013.01); *H01L 31/022466* (2013.01); *H01L 31/022475* (2013.01); *H01L 31/022483* (2013.01); *H01L 31/0304* (2013.01); *H01L 31/03046* (2013.01); *H01L 31/0693* (2013.01); *H01L 31/1844* (2013.01)

(58) Field of Classification Search
None
See application file for complete search history.

(56) References Cited

U.S. PATENT DOCUMENTS

| | | | | |
|---|---|---|---|---|
| 3,462,606 A | * | 8/1969 | Case | H04L 25/26 250/214 R |
| 2012/0153417 A1 | * | 6/2012 | Shi | H01L 31/02327 257/432 |
| 2017/0018675 A1 | | 1/2017 | Meitl et al. | |
| 2017/0025991 A1 | | 1/2017 | Chou et al. | |

FOREIGN PATENT DOCUMENTS

WO 2016/081646 A1 5/2016

OTHER PUBLICATIONS

Lian et al, The role of setback layers on the breakdown characof AlGaAs/GaAs/GaN HBTs, phys.stat. sol. (c) 5, No. 6, 1989-1991 (2008) (Year: 2008).*

* cited by examiner

*Primary Examiner* — Shannon M Gardner
(74) *Attorney, Agent, or Firm* — Scully, Scott, Murphy & Presser, P.C.; L. Jeffrey Kelly, Esq.

(57) ABSTRACT

A photovoltaic charging system having a narrow-spectrum light source attuned to an absorption band of a photovoltaic cell may achieve power delivery of at least 0.5 mW/10,000 $\mu m^2$ upon stimulation of the photovoltaic cell with narrow-spectrum light.

12 Claims, 7 Drawing Sheets

| Illumination Conditions | Outdoor One Sun 100mW/cm² | | Average Room Light 0.5mW/cm² | | Laser Light 50mW/5mm², red laser | | Laser Light 5mW/10mm², 850nm | |
|---|---|---|---|---|---|---|---|---|
| Device Type | Si PV | III-V PV | Si PV | III-V PV | Si PV | III-V PV | Si PV | III-V PV |
| Output Voltage | 600mV | 1V | ~300mV | ~700mV | 800mV | 1.2V | 900mV | 1.3mV |
| 100μm x 100μm PV | | | | | | | | |
| *Photocurrent* | 3μA | 2.5μA | 15nA | 12nA | 200μA | 200μA | 2mA | 2mA |
| *Power Output* | 1μW | 2μW | 3nW | 6nW | 100μW | 170μW | 1.2mW | 1.8mW |
| 500μm x 500μm PV | | | | | | | | |
| *Photocurrent* | 75μA | 62μA | 375nA | 300nA | 5mA | 5mA | 2mA | 2mA |
| *Power Output* | 25μW | 50μW | 75nW | 150nW | 2.8mW | 4mW | 1.2mW | 1.8mW |

PHOTOVOLTAIC CHARGING SYSTEM

BACKGROUND

The present application relates to a semiconductor structure and a method of forming the same. More particularly, the present application relates to a photovoltaic charging system for converting incident light into electrical energy.

Wearable and portable devices are becoming increasingly computationally powerful and interconnected. Many wearable and portable devices (wearable devices or wearables) are capable of communicating with other devices and computer networks using cellular, Bluetooth, WiFi, or other forms of electromagnetic communication. Many devices include microprocessors capable of multi-Megahertz clock speeds, audio or video playback, or have integral displays with high refresh rates capable of video gaming or playback. Such increases in computational power, communication ability, or other device features are accompanied by increasingly large power storage capability and power consumption patterns.

Desirability, adoption, and usability of wearable devices may increase by reducing a time for charging such devices and/or by making devices more robust and less likely to break. Charging time for a wearable device may be reduced or eliminated by supplementing, or by entirely replacing, direct electrical charging (i.e., plugging a device into an outlet, battery, or other electrical power source) with photovoltaic (PV) charging. Photovoltaic charging using ambient interior light, or using direct sunlight, has long been a feature of some simple calculators and digital/electronic timepieces. However, ambient interior light (i.e., artificial light generated by incandescent light bulbs, fluorescent lighting, light emitting diode (LED) sources, or other light sources suitable for household or commercial workplace lighting) is insufficient to power devices with complex (e.g., multi-megahertz clock speed, playback capable, or having an integrated high-refresh rate display) wearable devices, whether the light is ambient or collected and focused.

Further, an electrical charging port of a device provides a failure point for many devices, and frequently provides a location for contaminants to enter such devices. Strain applied to an electrical charging port of a wearable or portable device may cause damage to the electrical charging port, or to interior circuit elements, such as solder joints attaching an electrical charging port to a circuit board. Water, dust, and other contaminants may also enter a device at the housing opening that permits access to an electrical charging port by an exterior charging cable. Contaminants may cause damage to a device's display (when present) or to internal circuit elements such as microprocessors, capacitors, antennas, or batteries. Elimination of an electrical charging port may facilitate waterproofing or sealing a housing of a device and increase the device's useful lifetime before damage may occur or a user wishes to replace it for reasons other than device damage.

An integrated photovoltaic charging system may supplement or replace other charging methods, such as inductive charging or direct electrical charging, when the flux of photons to which a PV cell is responsive is sufficiently high to provide a device with sufficient current during a charging cycle to power the device during a usage interval. A charging cycle may occur in a single session, or during multiple sessions throughout a usage interval. A usage interval may be a daily or weekly interval, or an interval corresponding another period of time in which a device may be worn, used, or carried without substantial interruption. One common example may be that of a user charging and carrying a cellular telephone on a daily basis, with a charging cycle occurring in a single overnight session, or in multiple shorter charging sessions occurring throughout a day of device usage.

SUMMARY

Aspects of the present application relate to a photovoltaic charging system including a narrow spectrum light source for generating a beam of light, and at least one photovoltaic cell configured to generate an electrical current upon receiving the beam of light.

Some aspects of the present application relate to a method of making a photovoltaic cell, in which a film stack is deposited on a deposition substrate. The film stack includes at least an N-type semiconductor film, a P-type semiconductor film, a first conductive layer, and a second conductive layer, where the N-type semiconductor film is between the first conductive layer and the P-type semiconductor film, the P-type semiconductor film is between the second conductive layer and the N-type semiconductor film, and the N-type semiconductor film directly contacts the P-type semiconductor film. Aspects of the method may also relate to adhering a first surface of the film stack to a handler, removing the deposition substrate from a second surface of the film stack that is opposite the first surface, preserving, in a first region of the film stack, the entirety of the film stack, and removing, in a second region of the film stack, at least the first conductive layer, the N-type semiconductor film, and the P-type semiconductor film, to expose the second conductive film. The method may also relate to forming, on the first conductive layer in the first region, and on the second conductive layer in the second region, at least one contact.

Some aspects of the present application relate to a photovoltaic cell including an N-doped semiconductor film and a P-doped semiconductor film, the N-doped semiconductor film and the P-doped semiconductor film providing a P/N junction, a first conductive layer and a second conductive layer, wherein the N-doped semiconductor film is between the first conductive layer and the P-doped semiconductor film, the P-doped semiconductor film is between the second conductive layer and the N-doped semiconductor film, and the N-doped semiconductor film directly contacts the P-doped semiconductor film. Aspects of the application may also relate to a window layer of the photovoltaic cell, the window layer having a first thickness not less than 400 nanometers (nm) and not greater than 3500 nm, the window layer comprising a conductive layer configured to carry at least 0.5 mW/10,000 $\mu m^2$.

BRIEF DESCRIPTION OF SEVERAL VIEWS OF THE DRAWINGS

FIG. 7 is a table of physical and electrical performance characteristics of embodiments of photovoltaic cells for a photovoltaic charging system in accordance with the present application.

DETAILED DESCRIPTION

Figure 1:
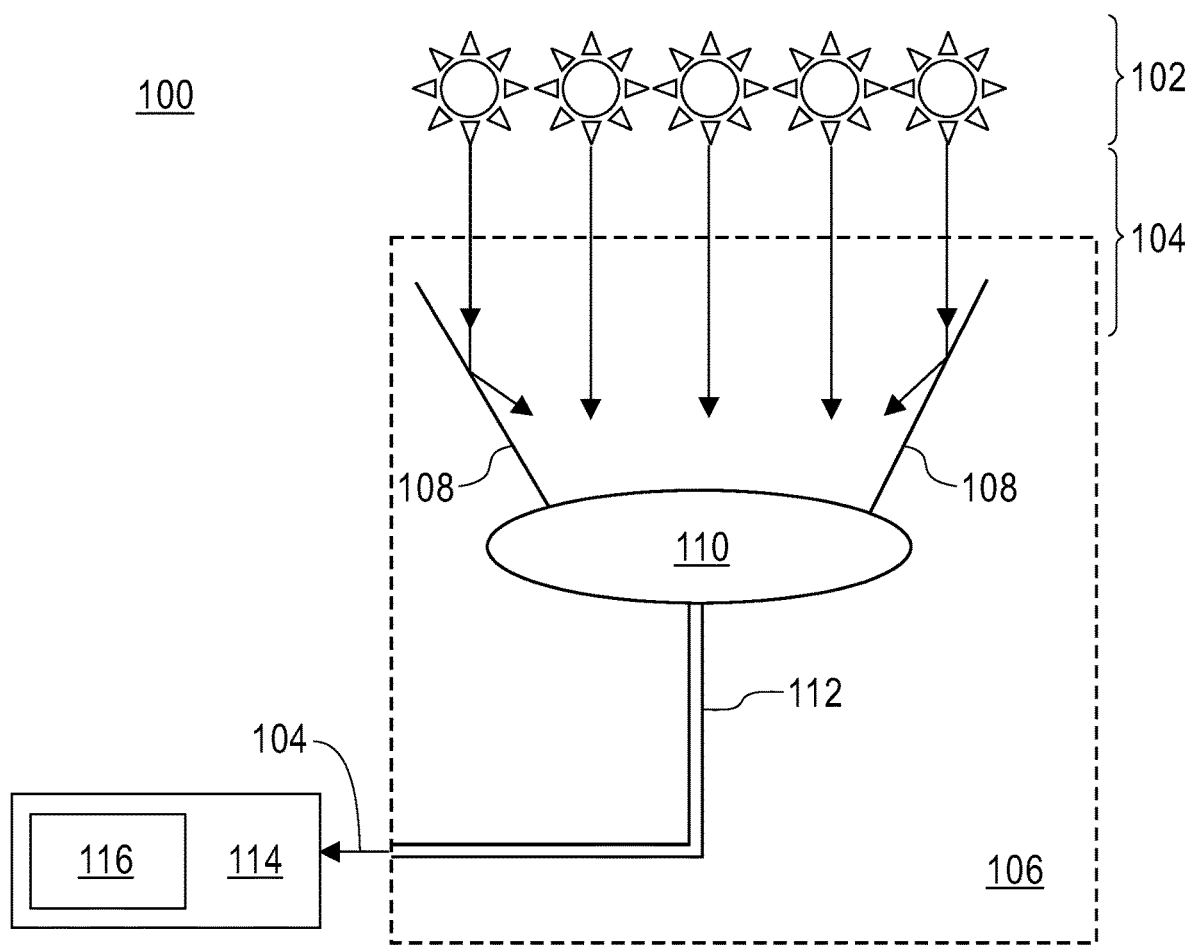
FIG. 1 is a diagram of a photovoltaic charging system, according to embodiments of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements may referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

One aspect of the present application that improves photovoltaic charging with regard to wearable and portable devices is the use, in PV charging systems, of a light source that outputs a narrow spectrum light to charge devices with integral PV cells responsive to the light of the narrow spectrum light source. A larger fraction of the light or photons generated by a narrow spectrum light source is absorbed by a responsive PV cell than for the light or photons generated by a broad spectrum light source. Use of a narrow spectrum light source counters industry trends of improving light conversion efficiency by combining multiple P/N junctions in a single PV cell, or by reengineering a PV cell chemistry to make individual P/N junctions sensitive to a broader spectrum of incident light wavelengths.

FIG. 1 is a diagram of a photovoltaic charging system 100 configured to provide photovoltaic charging of a device with a light source 102, according to some embodiments of the present application. Light source 102 is a narrow spectrum light source configured to emit light 104 having a wavelength distribution that is narrower than a broad wavelength distribution found in direct sunlight or in artificial lighting sources such as incandescent lights, fluorescent lights, etc. Some embodiments of narrow spectrum light sources may be laser light sources. A narrow spectrum light source may emit light in various bands, each band having a peak wavelength with a peak width, the peak width being generally less than ±10 nm from the peak wavelength. Some laser light sources may have peak widths of less than ±5 nm, or even less than ±2 nm. Laser light sources may be gaseous sources, may be liquid sources, or may be solid state laser sources, according to some embodiments of narrow spectrum light sources.

Broad spectrum lighting sources may produce numerous photons that cannot be absorbed by a photovoltaic cell. Examples of broad spectrum lighting sources may include incandescent lighting, direct solar irradiation, compact fluorescent lighting. Photons that do not activate formation of charge carrier pairs in a photovoltaic cell may be absorbed by the photovoltaic cell to form heat, or may be reflected from the cell.

In some embodiments, light source 102 is an excited vapor light source or a laser light source. Light source 102 may be a gas laser, dye laser, or solid state laser. In some embodiments, light source 102 has an emission band between 500 nanometers (nm) and 600 nm. In some embodiments, light source 102 has an emission band between 800 nm and 900 nm. In some embodiments, light source 102 is a helium neon (HeNe) laser, a gallium nitride (GaN) laser, a gallium aluminum arsenide (GaAlAs) laser, a Ti:sapphire laser, a Cr:fluoride laser, or another laser in the visible or infrared (including near-infrared) range. In some embodiments of the present application, a preferred type of laser may include semiconductor lasers using GaAs/AlGaAs, InP/InGaAsP/, or GaN/InGaN for compactness and portability. Power input into a laser is emitted as light with a narrow wavelength distribution. Single mode lasers may have individual laser emission line wavelength distributions that are up to 1 nm in width, while multi-mode lasers may have individual laser emission line wavelength distributions up to 5 nm in width. A wavelength distribution of a laser used as light source 102 may be selected according to a responsive range of a photovoltaic cell to convert the incident photons from light source 102 to electricity. The lasers and the PV cells may be selected in pairs wherein one or more laser emission lines of a selected laser type correspond to one or more absorption bands of a PV cell. In some embodiments of the present application, a GaAs PV cell may be paired with a GaAs QW laser, wherein the GaAs PV cell is configured to absorb light having a wavelength of 850 nm, and the GaAs QW laser may have an emission line centered at 850 nm.

A PV charging system may use one or more narrow spectrum light sources in conjunction with other charging system elements such as light collectors, focusers, or directors in order to brighten the intensity of incident light on a PV cell. In FIG. 1, light 104 emitted from light source 102 is directed toward collector 106, which includes mirrors 108, lenses 110, and light guides 112. Mirrors 108 capture light output from one or more light sources 102 and redirect the light 104 into a lens 110 in collector 106. Lens 110 directs light into a light guide 112 such as a fiber optic cable or light tube that can convey light from light source 102 onto a receiving region of a wearable device 114 having photovoltaic charging capacity. Light 104 may be emitted by light guide 112 onto wearable device 114 which converts the incident light 104 into electricity and stores it in storage cell 116 of wearable device 114.

Figure 2:
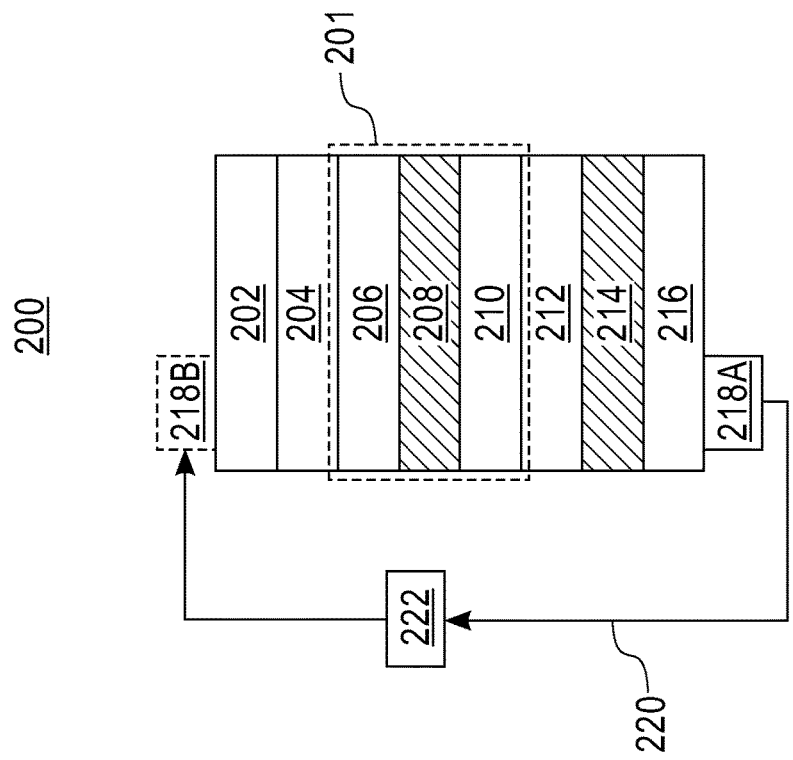
FIG. 2 is a diagram of a photovoltaic cell, according to embodiments of the present application.

FIG. 2 is a diagram of elements of embodiments of a photovoltaic cell 200 according to some embodiments of photovoltaic charging system 100. A central element of photovoltaic cell 200 is the P/N junction 201. In a P/N junction, some electrons of an N-doped semiconductor, in a region directly against a P-doped semiconductor, migrate into a region of the P-doped semiconductor called the depletion zone. In the depletion zone, the migrated electrons fill empty valence shells of atoms of the P-doped semiconductor, and light absorption and current generation (i.e., carrier pair formation) occurs. P/N junction 201 is situated within a stack of conductive or semiconductive layers that allow pairs of charge carriers generated by the absorption of a photon to migrate out from the P/N junction and through the several layers of PV cell 200 into circuit 220 to do electrical work or to be stored in an energy storage device like a battery, a capacitor, or some other means for storing electrical energy. PV cell 200 includes, from top to bottom ("top" meaning a side where light can enter the layers of PV cell 200 to trigger current generation), a contact layer 202, a window layer 204, and an emitter layer 206, from which electrons move into circuit 220. PV cell 200 may also include base layer 210, back surface field (BSF) layer 212, and substrate 216. In some embodiments of PV cell 200, a transparent oxide layer (not shown, but see FIG. 6 element 610) may be situated above a window layer and below a contact layer in order to promote conduction of large (e.g., >1 mW) electrical currents generated by individual photovoltaic cells of a wearable device.

Light is converted into electricity when photons travel through one layer of the semiconductor material stack and creates pairs of charge carriers by exciting electrons (negative charge carriers) in the depletion layer to higher energy levels in the N-doped semiconductor, and by leaving holes (positive charge carriers) in the P-doped semiconductor. Because the P/N junction poses a barrier to immediate recombination of the charge carriers, the excited electron and accompanying "hole" seek to recombine by traveling through an electrical circuit that circumvents the P/N junction barrier and connects the N-doped and the P-doped semiconductor materials. Recombining charge carriers may be used to perform electrical work or to store energy in capacitors, in chemical batteries, or other energy storage devices.

In some embodiments, contact layer 202, window layer 204, and emitter layer 206 are N-doped layers of PV cell 200. Contact layer 202 may be doped with a larger concentration of N-type dopant than window layer or emitter layer 206, according to some embodiments. The term "n-type dopant" refers to the addition of impurities that contributes free electrons to an intrinsic semiconductor. In a silicon containing semiconductor material, examples of n-type dopants, i.e., impurities, include, but are not limited to, antimony, arsenic and phosphorous. Base 210 and substrate layer 216 may be P-doped layers. The term "p-type dopant" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. Base 210 may be doped less heavily than substrate 216. In some embodiments of PV cell 200, a back surface field (BSF) layer 212 (more strongly P-doped than the base layer) may be deposited between base layer and substrate 216 in order to prevent carrier recombination at the back of the base layer 210. In some embodiments, one or more buffer layers 214 may be present in order to regulate a crystal lattice constant of PV cell 200 at the bottom side of base layer 210 and a top side of substrate 216 to promote good layer adhesion and good electrical characteristics of the PV cell. In some embodiments, a setback layer 208 may be present between base layer 210 and emitter 206 to offset dopant diffusion and increase current gain. Other layers may be present in the PV cell 200 according to manufacturing flows, device designs, and other aspects of developing and producing photovoltaic cells for photovoltaic charging. A substrate and a contact layer may be connected to circuit 220 by a first electrode 218A and a second electrode 218B according to some embodiments. Electrodes may be metallic layers deposited onto a top and bottom surface of a PV cell in order to promote good electrical connection between the PV cell stack and the external load 222 connected thereto.

Layers in PV cell may be based on silicon semiconductor material, binary (e.g. III-V) semiconductors, or other types of semiconductor materials that can be incorporated into a PV cell manufacturing flow. In some embodiments, contact layer 202 may comprise a silicon layer, a gallium arsenide layer, an aluminum gallium arsenide layer, an indium gallium arsenide layer, or some other low bandgap semiconductor material. Contact layer 202 may be N-doped with dopants such as phosphorous (P) or tellurium (Te). An N-type dopant concentration in contact layer 202 may at least $3 \times 10^{18}$ atoms/cm$^3$ according to some embodiments. Contact layer 202 may have a thickness ranging from 400 nm to 1200 nm, although other thickness are also envisioned.

Window layer 204 may comprise a silicon layer, a gallium arsenide layer, an indium gallium phosphide (InGaP) layer, an aluminum gallium arsenide (AlGaAs) layer, or some other wide bandgap semiconductor material lattice matched to the substrate, according to embodiments. Window layer 204 may be N-doped to a degree less than the dopant concentration in contact layer 202. Window layer 204 may have an N-type dopant concentration ranging from $1 \times 10^{18}$ atoms/cm$^3$ to $5 \times 10^{18}$ atoms/cm$^3$. Window layer 204 may have a window layer thickness ranging from 400 nm to 3500 nm, according to some embodiments, in order to manage power output of not less than 1 mW/10,000 µm$^2$ for a silicon based photovoltaic cell and 2 mW/10,000 µm$^2$ for a III-V semiconductor based photovoltaic cell. Current (i.e., charge carriers) from the P/N junction may travel up through the stack of layers in PV cell 200 and travel through window layer 204 toward contact 202 and an electrode.

The power delivered by a PV cell to a wearable device may depend on both the size/active/absorption area of the PV cell and on the spot size of the beam of light received by the PV cell. Electricity generation from photovoltaic cells may be improved, from an efficiency and cost perspective, when an incident beam of light has a spot size that corresponds to a PV cell active/absorption area, with no light falling outside the absorption area of the PV cell, and no PV cell absorption area sitting idle (e.g., not receiving light from the incident beam). However, in some embodiments of the present application, a beam of light may overlay multiple PV cells and/or PV cell active/absorption areas, with some incident light not being converted into electricity. The light intensity of a wavelength absorbed by one or more PV cells in a wearable device may generate sufficient electrical current that an excess of light may be generated at little additional cost (e.g., acceptable planned inefficiency) relative to the benefit of photovoltaic charging of the device.

P/N junction 201 may comprise at least emitter 206 and base layer 210. In some embodiments, a setback layer 208 may also be located within P/N junction 201 to reduce carrier recombination at the P/N junction interface between the emitter and base layers. Emitter 206 may comprise an N-doped semiconductor material such as silicon, gallium arsenide (GaAs), or some other III-V semiconductor material compatible with window layer 204 or base layer 210. In some embodiments of the present application, an emitter layer may include AlGaAs or InGaP for photovoltaic cells formed on a GaAs substrate. In some embodiments of the present application, the emitter layer may be InP for photovoltaic cells formed on an InP substrate. Emitter 206 may be N-doped to a concentration less than the dopant concentration in contact layer 202, the emitter layer N-dopant concentration generally ranging from $5 \times 10^{19}$ atoms/cm$^3$ to $5 \times 10^{18}$ atoms/cm$^3$, although other concentrations are also envisioned. Emitter 206 may have an emitter layer thickness ranging from 70 nm to 200 nm, according to embodiments. In some embodiments, emitter 206 has a thickness that is approximately 100 nm.

Base layer 210 in P/N junction 201 may comprise a same type of semiconductor as can be found in emitter 206, with an opposite dopant type (i.e., the emitter is N-doped silicon, and the base is P-doped silicon, or the emitter is N-doped GaAs, and the base is P-doped GaAs). In some embodiments of the present application, the base layer may be AlGaAs or InGaP for photovoltaic cells on GaAs substrate. Some embodiments may include an InP base layer for photovoltaic cells on an InP substrate. Use of two different types of semiconductor material (e.g., Si emitter and GaAs base) may create an additional barrier to the creation of charge carrier pairs upon absorption of a photon, reducing PV cell conversion efficiency. Base layer 210 may be doped with a P-type dopant such as P, Te, or Al, although other P-type dopants are also envisioned. P-type dopant in the base layer 210 may have a concentration ranging from $5 \times 10^{17}$ to $1 \times 10^{18}$ atoms/cm$^3$, according to some embodiments.

Setback layer 208 may be a layer that prevents dopant diffusion from p type layers into n type layers. In some embodiments, the setback layer 208 may be a doped silicon layer, or a doped III-V semiconductor layer. In some embodiments, the setback layer 208 may be an GaAs layer having 1% In dopant and 99% Ga (e.g., $In_{0.01}Ga_{0.99}As$). In some embodiments, the fraction of indium in a doped GaAs semiconductor may be as low as 0.5% and as much as 3%.

Base layer 210, BSF layer 212, and substrate 216 may all be P-doped semiconductor materials such as silicon, gallium arsenide, or some other type III-V semiconductor material. The back surface field layer (BSF) layer prevents the charges to diffuse to the wrong direction and helps to increase PV efficiency. In some embodiments, base layer 210 has a thickness ranging from 2000 nm to 4000 nm. In some embodiments, a protector used for the base layer 210, BSF layer 212, and substrate 216 may be zinc or some other acceptable form of P-type dopant. In some embodiments, protective concentration and base layer 210 may range from $1 \times 10^{16}$ to $5 \times 10^{17}$ atoms/cm$^3$. In some embodiments, a concentration of pre-type dopant is approximately $1 \times 10^{17}$ atoms/cm$^3$.

In some embodiments, BSF layer 212 has a P-type dopant concentration greater than the P-dopant concentration in base layer 210. Buffer layer 214 may include one or more sub-layers deposited in order to modify a lattice constant in the stack of photovoltaic cell layers. For example, a substrate such as substrate 216 may have a different lattice constant than BSF layer 212. In order to promote good adhesion between the layers, and, in order to promote good electrical conductivity between the layers, one or more buffer layers may be deposited between a substrate and a BSF layer in order to provide a smooth transition between a substrate having one first lattice constant and a BSF layer having a different lattice constant. A sub-layer of a buffer may have different dopant concentrations from an adjacent buffer sub-layer, or may be a different semiconductor material, in order to resolve a lattice mismatch through the photovoltaic cell film stack.

Figure 3:
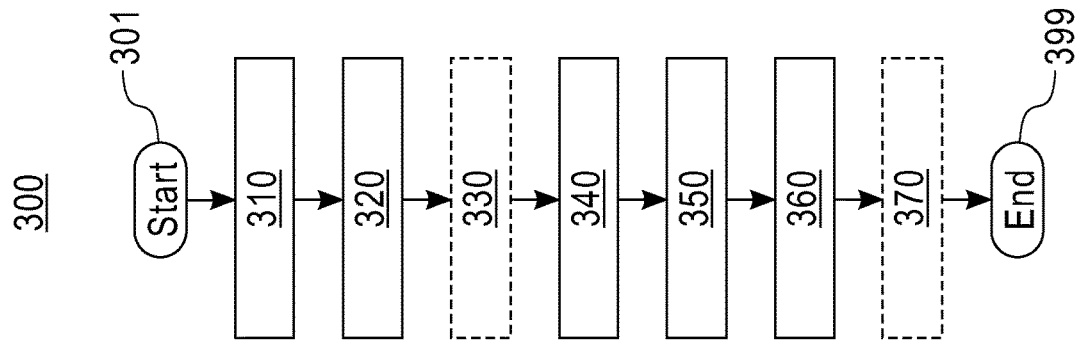
FIG. 3 is a flow diagram of a representative method of making a photovoltaic cell in accordance with an embodiment of the present application.

FIG. 3 is a flow diagram of a method 300 for making a photovoltaic cell consistent with the application hereinabove. The method begins in operation 301. In a first operation 310, a plurality of layers of semiconductor materials may be deposited onto a deposition substrate in order to form a photovoltaic cell film stack. Layers deposited onto a deposition substrate may be consistent with the layers disclosed previously in the discussion regarding FIG. 2. In particular, the layers deposited may include a window layer and/or a transparent oxide layer configured to conduct large (e.g., >0.5 mW/10,000 μm$^2$) currents generated by the manufactured photovoltaic cell responding to light form high intensity narrow spectrum light sources. In an operation 320, a face of the semiconductor film stack may be adhered to a handler base with an adhesive material in order to facilitate positioning and processing the semiconductor film stack to generate photovoltaic cells. According to some embodiments, the face of the semiconductor film stack adhered to the handler base may be a substrate layer of the photovoltaic cell film stack (the last-deposited layer on the deposition substrate). In an optional operation 330, subsequent to adhering the semiconductor film stack to the handler base, the deposition substrate may be removed from the semiconductor film stack. In some embodiments of operation 330, the deposition substrate may not be completely removed, but maybe substantially thinned in order to allow transmission of optical or infrared photons into the semiconductor film stack subsequent to formation of photovoltaic cells by the method 300.

In an operation 340, a first region of the photovoltaic film stack may be protected by a mask and a portion of the photovoltaic film stack in a second region may be removed in order to expose a substrate layer in the photovoltaic film stack. The first region of the photovoltaic film stack may substantially correspond to a light absorbing region of the photovoltaic cell being manufactured, and a region for an electrical contact or electrode to be formed on a photovoltaic cell surface. The second region may correspond to a region for an electrode or electrical contact against a substrate layer of the photovoltaic cell to be positioned in the photovoltaic cell.

In an operation 350, the portion of photovoltaic film stack within/below the second region may be removed by a plasma or an aqueous etching process to expose a region of the substrate layer approximately corresponding to the second region of the semiconductor film stack within a perimeter of a photovoltaic cell of the film stack.

In an operation 360, electrical contacts and/or metal electrodes may be formed on a top surface of the photovoltaic cell, and on the exposed region of the photovoltaic cell substrate layer within the second region that was exposed during operation 350. Electrode and/or electrical contact formation may occur by a variety of processing steps known to practitioners of the art. During an optional operation 370, individual photocells may be removed from the handler base or adhesive layer. According to some embodiments of operation 370, individual photocells may be separated from each other by cleaving, by etching a separation space between adjacent photocells, or by other methods known to practitioners in the art. In some embodiments, individual photocells may be incorporated into a circuit or a wearable device upon removal from the handler base or adhesive. In some embodiments of operation 370, individual photocells may be stored before inclusion in an electrical circuit or wearable device.

Figure 4A:
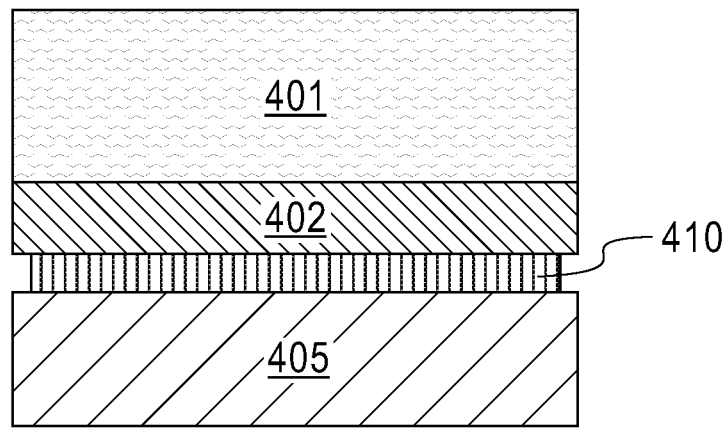
FIGS. 4A-4D are diagrams of various stages of a method for making photovoltaic cells, according to embodiments of the present application.
Figure 4B:
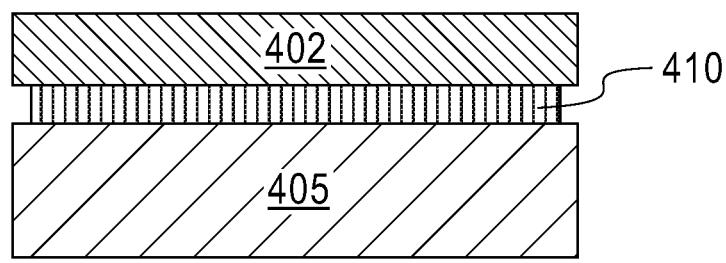

FIGS. 4A-4D depict a first manufacturing assembly 400 in various stages of a manufacturing process similar to a manufacturing flow described in the flow diagram of FIG. 3. FIG. 4A is a diagram of a full photovoltaic film stack 402 on a deposition base 401 after being adhered to a handler base 405 by an adhesive 410. Deposition base 401 may be a semiconductor wafer or other substrate capable of receiving material deposited by various chemical vapor deposition (CVD) processes to build up layers of doped and undoped semiconductor materials for a photovoltaic cell. Deposition base 401 may also be capable of withstanding diffusion, implanting, and annealing steps to make photovoltaic film stack 402 and to adjust a dopant profile/modify strain levels within the film stack. First manufacturing assembly 400 may correspond to a structure formed during or subsequent to operation 320 of FIG. 3. FIG. 4B is a diagram of a second manufacturing assembly 420 after, according to some methods, deposition substrate 401 has been removed from photovoltaic film stack 402 to expose a surface of photovoltaic film stack 402. Deposition substrate 401 may be removed by etching or by chemical mechanical polishing or some other method of thinning or removing the deposition substrate without harming layers of the PV film stack 402. Second manufacturing assembly 420 may correspond to an assembly formed during or subsequent to operation 330 of flow diagram 300.

Figure 4C:
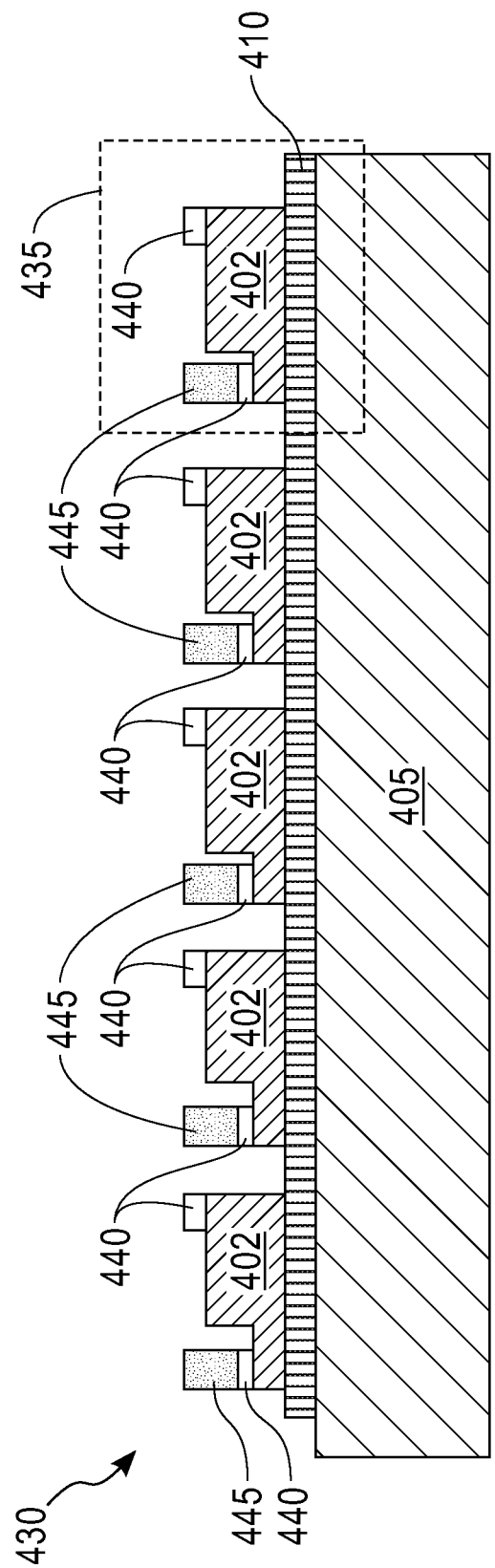

FIG. 4C is a diagram of a third manufacturing assembly 430 having individual photovoltaic cells subsequent to, e.g., operation 370 of flow diagram 300, where individual photovoltaic cells 435 have been isolated from each other on handler base 405, and wherein electrical contacts 440 and 445 have been formed in anticipation of fastening an individual photovoltaic cell to an electrical circuit. Electrical contacts 440 may be configured to have good adhesion and electrical contact with the photovoltaic cell film stack and to reduce contact resistance, and electrical contact 445 may be configured to promote ease of soldering or electrically connecting an individual photovoltaic cell to a circuit board by eliminating a height differential between contacts at different levels of photovoltaic film stack 402.

Figure 4D:
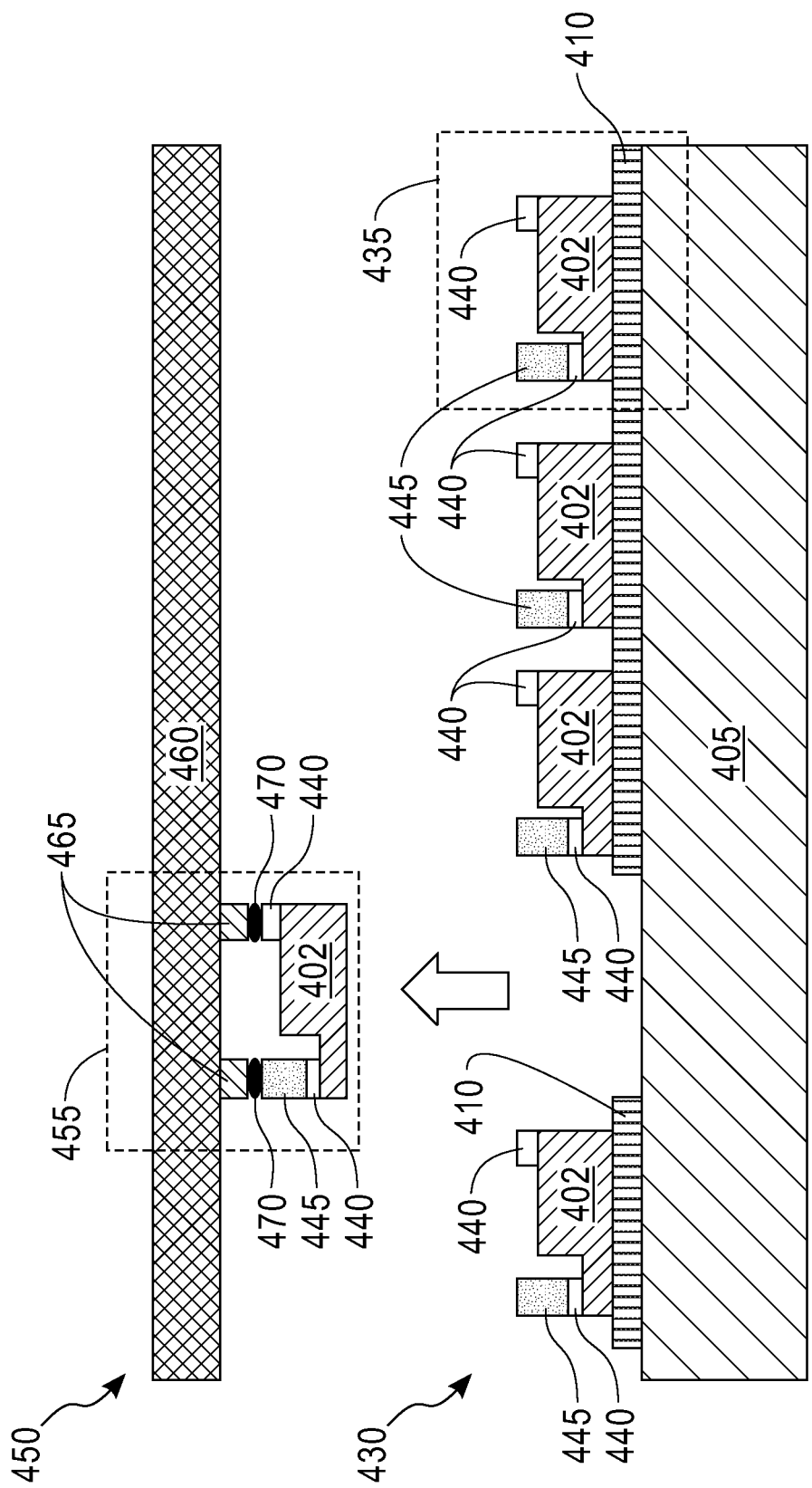

FIG. 4D is a diagram of a fourth manufacturing assembly 450, having a device circuit 455 positioned adjacent to third manufacturing assembly 430, after an individual photovoltaic cell 455 has been removed from third manufacturing assembly 430, and attached to a circuit board 460 of a device. Circuit board 640 electrically connects to individual photovoltaic cell 455 by device electrical contacts 465 and solder joints 470 that connect to either electrical contact 445 or electrical contact 440 of individual photovoltaic cell 455.

Figure 5:
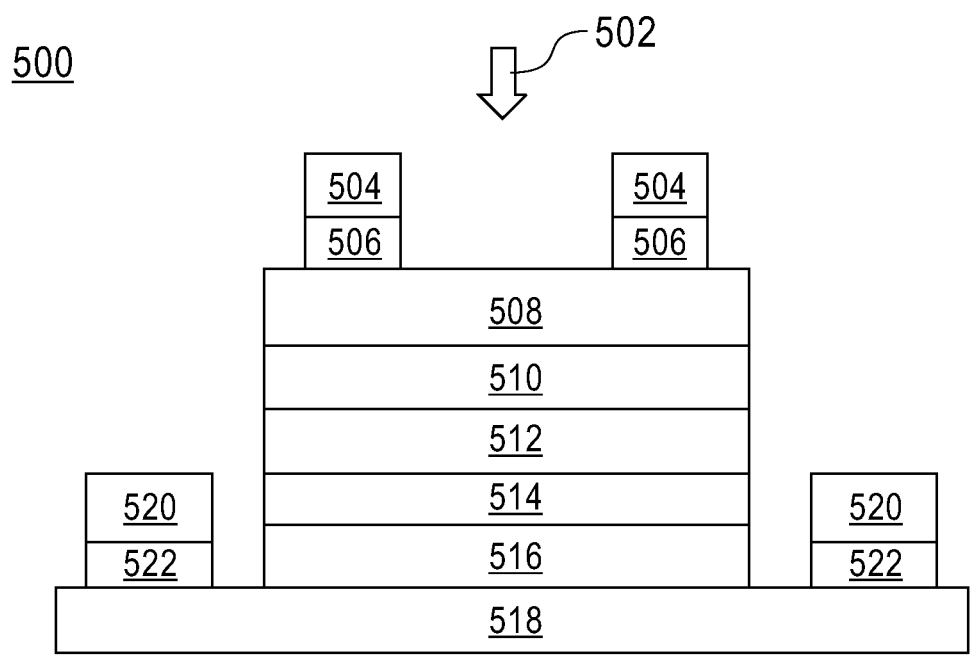
FIG. 5 is a diagram of a photovoltaic cell having a window layer, according to embodiments of the present application.

FIG. 5 is a diagram of a photovoltaic cell 500 that may correspond to an individual photovoltaic cell similar to element 435 of FIGS. 4C and 4D, or to an individual photovoltaic cell as formed subsequent to operation 370, according to some embodiments. Photovoltaic cell 500 is configures such that incident light 502 may strike a window layer 508 having thereon one or more contact layers 504, 506. Contact layer 504 may be a metallic contact, and contact layer 506 may be a semiconductor layer material that has been doped to improve conductivity of electrons from emitter layer 510 to an electrical circuit connected to contact 504. Contact layer 504 may comprise one or more of Ag, Pt, Ti, Au, Al, etc. Contact layer 506 may be a semiconductor material such as silicon or a III-V semiconductor selected from at least gallium arsenide (GaAs) or gallium phosphide (GaP). Contact layer 506 may be doped with an N-type dopant such as phosphorous to promote charge carrier conduction through the photovoltaic cell 500.

Window layer 508 may be situated between contact layer 506 and emitter 510. Window layer 508 may comprise a gallium phosphide (GaP) layer, an indium gallium phosphide (InGaP), a gallium arsenide (GaAs) layer, an aluminum gallium arsenide (AlGaAs) layer, or some other semiconductor configured to conduct current. The window layer may have a window thickness ranging from 300 nm to 3500 nm, although preferred embodiments may have window thickness ranging from 400 nm to 3000 nm.

Emitter 510 is situated between window layer 508 and base layer 512. Emitter layer may be an n-doped semiconductor such as silicon or gallium arsenide (GaAs), among other III-V semiconductor. Emitter 510 may be N-doped in order to form a P/N junction with base layer 512. An emitter may have a thickness ranging from 70 nm to 130 nm, with a preferred thickness of 100 nm. Dopant concentration in an emitter layer may range from $9 \times 10^{19}$ atoms/cm$^3$ to $3 \times 10^{18}$ atoms/cm$^3$.

Base layer 512 may comprise a second part of a photovoltaic cell P/N junction, being a P-doped semiconductor material such as silicon, gallium arsenide (GaAs), or some other III-V semiconductor. Base layer 512, back surface field (BSF) 514, and setback layer 516 may all be P-doped layers, with a P-type dopant concentration in base layer 512 being smaller than a P-type dopant concentration in either BSF layer 514 or setback layer 516. A P-type dopant concentration in base layer 512 may range from $1 \times 10^{18}$ to $5 \times 10^{17}$ atoms/cm$^3$. Back surface field layer 514 may be a gallium phosphide (GaP) or indium gallium phosphide (InGaP) layer, or a gallium arsenide (GaAs) or indium gallium arsenide (InGaAs) layer configured to prevent carrier recombination within the film stack. Buffer layer 516 may be a P-doped gallium arsenide layer configured to adjust a lattice constant between substrate 518 and back surface field layer 514. Buffer layer 516 may be P-doped. In some embodiments, buffer layer 516 may undoped (i.e., an intrinsic semiconductor material). Electrical contact may, in some embodiments, be a P-doped semiconductor material, while contact 520 may be a metallic layer above contact layer 522.

Substrate 518 may be a silicon substrate or a III-V semiconductor material configured to provide electrical conductivity between the base layer 512 and electrical contacts 520 and 522. Electrical contacts 520 and 522 may be semiconductor and/or metallic layers configured to connect to an external circuit having an external load to receive and/or perform work upon formation of charge carrier pairs by light absorbed at the photovoltaic cell P/N junction. In some embodiments, a photovoltaic film stack may have two or more P/N junctions within the stack. Each P/N junction in a film stack may be configured to respond to a different wavelength of light, in some embodiments, or to a same wavelength of light when light flux is quite high and a single P/N junction cannot process all incident photons from a light source.

Figure 6:
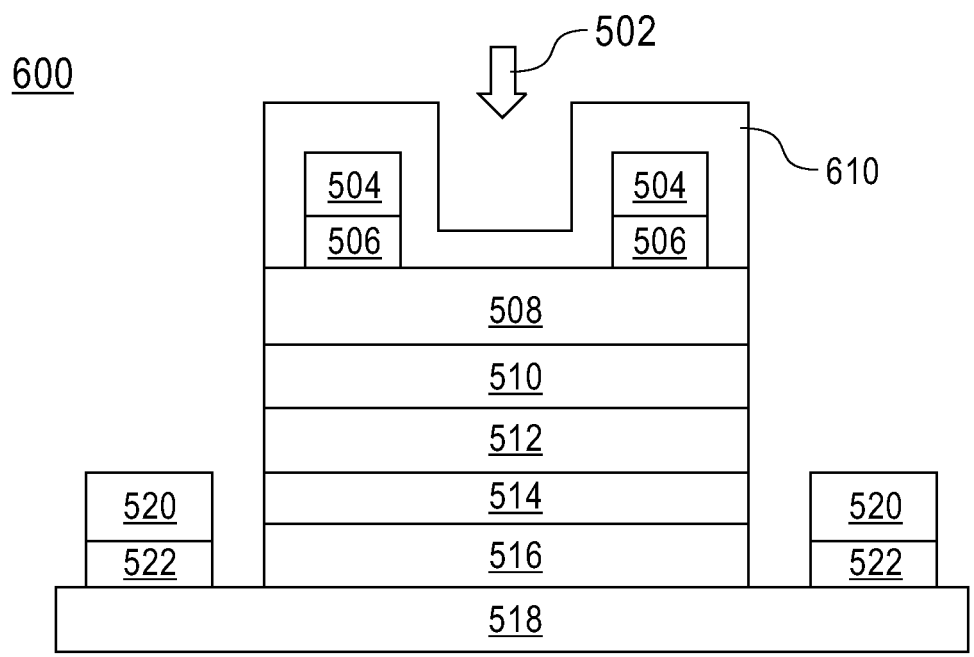
FIG. 6 is a diagram of a photovoltaic cell having a transparent oxide layer, according to embodiments of the present application.

FIG. 6 depicts a photovoltaic cell 600 having a structure substantially similar to the structure described for photovoltaic cell 500. Photovoltaic cell 600 differs from photovoltaic cell 500 in that a transparent oxide layer 610 has been deposited in the stack on top of window layer 508 and below contact layer 504. Window layer 508 may serve to conduct charge carriers (electrons) from the emitter to a contact layer 504 and an attached electrical circuit. Previous embodiments of photovoltaic cells have employed thin window layers to reduce light absorption by the window layer, seeking to increase photon flux to the current-generating P/N junction within the photovoltaic cells. The present application sacrifices some transparency of the window layer for increased current-carrying capacity to handle a large current formed from an intense illumination by narrow-spectrum light sources onto photovoltaic cells.

A transparent oxide, or transparent conductive oxide (TCO) may be used as a front conductive electrode material for photovoltaic cells. A transparent oxide may be an indium tin oxide (InSnO), a fluorine-doped tin oxide (FTO), or an aluminum-doped zinc oxide (AZO), according to embodiments, although other transparent oxides are also envisioned. A thickness of transparent oxide may be selected to balance transparency of the transparent oxide layer with current-carrying capacity. In some embodiments, a thickness of the transparent oxide layer may range from 150 nm to 800 nm. A thickness of transparent oxide may also be selected according to an anticipated incident light flux from a light source, in order to meet a desired photoconversion rate for a range of light intensities without light loss due to absorption or scattering by either the transparent oxide or the window layer.

One aspect of traditional photovoltaic cell designs is that the conversion of light to electrical current scales with the area of the photovoltaic cell, light intensity of wavelengths to which the photovoltaic cell is sensitive/responsive (e.g., from which current may be generated), and a distribution of wavelengths in the light source shining on a photovoltaic cell. A photovoltaic cell may have an active, or light absorbing, area of 10,000 $\mu m^2$ (e.g., 100 $\mu m \times 100$ $\mu m$). An amount of output power anticipated from a III-V photovoltaic cell having 10,000 $\mu m^2$ of light absorbing area may vary according to a type of light source, as follows: one sun's worth of solar radiation (i.e., direct sunlight) may produce approximately 1 $\mu W$ of power; internal artificial lighting may produce approximately 0.005 $\mu W$, focused light emitting diodes may produce 0.5 $\mu W$ of power, light from a commercially available laser pointer (e.g., a HeNe laser pointer or an argon (green light) laser pointer) may generate greater than 10 $\mu W$ of power, and a well focused laser diode may generate approximately 1000 $\mu W$ of power.

Wearable devices may begin to be sufficiently charged for normal modes of operation (e.g., daily charging/wearing cycles) when photovoltaic charging can meet or exceed a current of 1 $\mu W$ per 1 MHz of device clock speed. In an embodiment of a III-V semiconductor photovoltaic cell has been demonstrated to generate 400 $\mu W/cm^2$ of light absorbing area under ambient internal artificial lighting, 50 milli-Watts (mW)/$cm^2$ under a red laser pointer (e.g., a HeNe laser) of light absorbing area, and over 1.3 mW/10 $\mu m^2$ of light absorbing area under a 830 nm laser when the emitted light was gathered and directed onto the photovoltaic cell using a lensed fiber optic cable. Reductions in backside shadowing (e.g., illumination of the back side of the photovoltaic cell, not just the 'top' side), increased laser power, and reduced resistance may all contribute to increases in measured power output from the photovoltaic charging systems described above.

FIG. 7 is a table 700 of electrical performance of photovoltaic charging systems under a variety of conditions. Notably, table 700 depicts information regarding electricity generation using broad spectrum light sources (direct solar radiation and interior artificial light) and narrow spectrum light sources (red HeNe laser and near IR laser light), silicon and III-V photovoltaic cell materials, and accounting for PV cell light absorption areas when generating electrical current. In some embodiments of the present application, a photovoltaic cell active area may be larger than a spot size of a beam of light directed toward the PV cell active area. In some embodiments of the present application, a PV cell active area may be smaller than the spot size of a beam of light directed toward the PV cell active area. The information depicted in table 700 may be representative, but not exclusively descriptive, of the range of voltages, currents, and power output, of various photovoltaic cells envisioned by the present disclosure, including charging systems where a beam spot (for the laser light reported values) is smaller than the beam area of a 100 $\mu m \times 100$ $\mu m$. Other values of output voltages, current output, and power output, are also envisioned according to the present application, using modifications to PV cell active areas, light beam spot size, and variations in light wavelength and PV cell materials. Of particular note is that the aforementioned 1 mW power output threshold appears to be exceeded when using laser light for each type of photovoltaic cell (Si PV and III-V PV) for both cell sizes (100 $\mu m \times 100$ $\mu m$ and the 500 $\mu m \times 500$ $\mu m$).

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A system, comprising:
a narrow spectrum light source for generating a beam of light;
a photovoltaic cell located at a receiving region of a wearable device and configured to receive the beam of light and generate a current therefrom, wherein the current generated by the photovoltaic cell is stored in a storage cell that is present in the wearable device and wherein the photovoltaic cell consists of a single junction cell having a single P-N junction having an absorption band that corresponds to an emission line of the beam of light, wherein the single P-N junction comprises an N-doped emitter region and a P-doped base region, and wherein a setback layer is sandwiched between the emitter region and the base region and the setback layer is composed of GaAs having 0.5 to 3% In dopant; and
a lens to direct the beam of light into a light guide, the light guide selected from a fiber optic cable or a light tube, the light guide conveying the beam of light to the photovoltaic cell.

2. The system of claim 1, wherein the photovoltaic cell further comprises an N-doped optical window layer having a thickness of at least 400 nanometers (nm) and not more than 3500 nm.

3. The system of claim 2, wherein the optical window further comprises at least one of an N-doped indium gallium phosphide (InGaP) window layer and an N-doped aluminum gallium arsenide (AlGaAs) window layer.

4. The system of claim 2, further comprising a transparent conductive oxide layer.

5. The system of claim 4, wherein the transparent conductive oxide layer comprises one or more of indium tin oxide, fluorine-doped tin oxide, or aluminum doped zinc oxide.

6. The system of claim 4, wherein the transparent oxide layer has a thickness of not less than 200 nanometers (nm) to not more than 800 nm.

7. The system of claim 6, wherein a majority of the top side of the N-doped window layer forms an interface with the transparent oxide layer.

8. The system of claim 2, wherein the narrow-spectrum light source is configured to generate a beam of light having a wavelength distribution of not more than 10 nm from a band center of the beam of light.

9. The system of claim 8, wherein the beam of light generated by the light source has a wavelength of 550 nm ±5 nm.

10. The system of claim 8, wherein the beam of light generated by the light source has a wavelength of 850 nm ±5 nm.

11. The system of claim 8, wherein the light source further comprises a light emitting diode lamp.

12. A system, comprising:
- a narrow spectrum light source for generating a beam of light;
- a photovoltaic cell located at a receiving region of a wearable device and configured to receive the beam of light and generate a current therefrom, wherein the current generated by the photovoltaic cell is stored in a storage cell that is present in the wearable device and wherein the photovoltaic cell consists of a single junction cell having a single P-N junction having an absorption band that corresponds to an emission line of the beam of light comprising:
- an N-doped semiconductor film;
- a P-doped semiconductor film, the N-doped semiconductor film and the P-doped semiconductor film providing a P/N junction;
- a setback layer sandwiched between the N-doped semiconductor film and the P-doped semiconductor film and the setback layer is composed of GaAs having 0.5 to 3% In dopant;
- a first conductive layer;
- a second conductive layer, wherein
  the N-doped semiconductor film is between the first conductive layer and the P-doped semiconductor film,
  the P-doped semiconductor film is between the second conductive layer and the
  N-doped semiconductor film; and
- a lens to direct the beam of light into a light guide, the light guide selected from a fiber optic cable or a light tube, the light guide conveying the beam of light to the photovoltaic cell.

* * * * *